United States Patent
Mavencamp

[19]

[11] Patent Number: 6,114,893
[45] Date of Patent: Sep. 5, 2000

[54] GAIN STAGE WITH IMPROVED POWER SUPPLY REJECTION

[75] Inventor: Dan Mavencamp, Brandon, Miss.

[73] Assignee: Texas Instruments Incorporated, Dallas, Tex.

[21] Appl. No.: 09/015,485

[22] Filed: Jan. 28, 1998

Related U.S. Application Data

[60] Provisional application No. 60/036,180, Jan. 29, 1997.

[51] Int. Cl.[7] ........................................... H03K 5/08
[52] U.S. Cl. ........................... 327/313; 327/327; 327/384
[58] Field of Search ..................... 327/313, 327, 327/384, 379, 538

[56] References Cited

U.S. PATENT DOCUMENTS

| | | | |
|---|---|---|---|
| 5,198,701 | 3/1993 | Davies et al. | 327/513 |
| 5,455,533 | 10/1995 | Kollner | 327/484 |
| 5,614,850 | 3/1997 | Corsi et al. | 327/55 |
| 5,754,076 | 5/1998 | Kimura | 327/563 |

*Primary Examiner*—Terry D. Cunningham
*Attorney, Agent, or Firm*—Alan K. Stewart; Wade James Brady, III; Richard L. Donaldson

[57] ABSTRACT

A gain stage circuit includes a first transistor $Q_3$ having a control node coupled to a bias node $V_{B1}$; a second transistor $Q_2$ having a control node coupled to the bias node $V_{B1}$; a third transistor $Q_1$ coupled in series with the second transistor $Q_2$ and having a control node coupled to an input node $V_{IN}$; a fourth transistor $Q_5$ matched to the second transistor $Q_2$ and having a control node coupled to the bias node $V_{B1}$; a current subtracting circuit 22 coupled to the second and fourth transistors $Q_2$ and $Q_5$; and a quiet current generator 20 coupled to the current subtracting circuit 22, the current subtracting circuit 22 subtracts a current in the fourth transistor $Q_5$ from a quiet current in the quiet current generator 20.

3 Claims, 1 Drawing Sheet

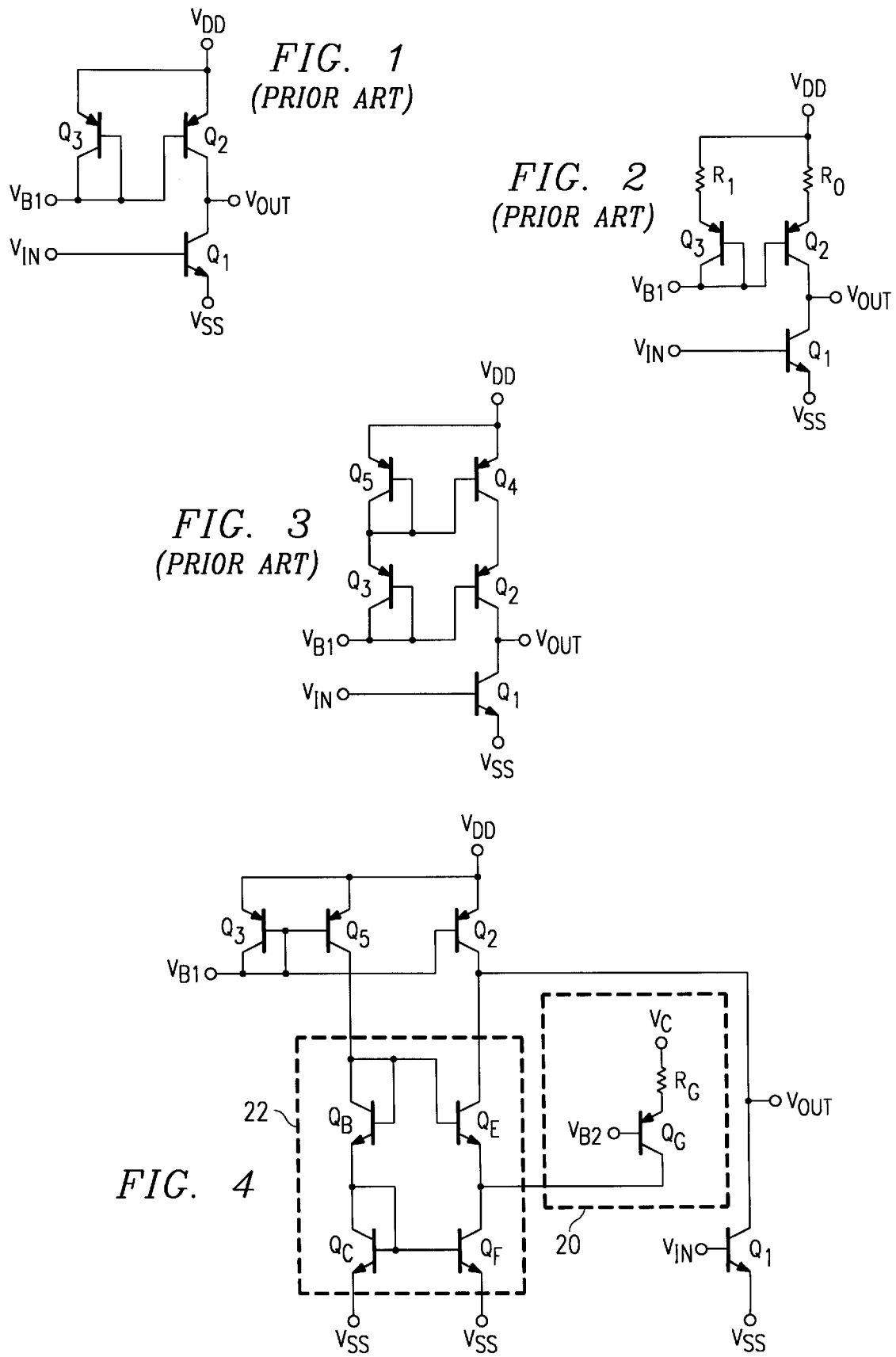

6,114,893

GAIN STAGE WITH IMPROVED POWER SUPPLY REJECTION

This application claims benefit of provisional application Ser. No. 60/036,180 filed Jan. 29, 1997.

FIELD OF THE INVENTION

This invention generally relates to electronic circuits and in particular it relates to bipolar and CMOS gain stages where a high level of noise rejection from the power supply to the output node is required.

BACKGROUND OF THE INVENTION

FIG. 1 shows a prior art standard bipolar gain stage with poor power supply rejection. The prior art circuit of FIG. 1 includes transistors $Q_1$–$Q_3$, negative rail $V_{SS}$, positive rail $V_{DD}$, input voltage $V_{IN}$, output voltage $V_{OUT}$, and bias voltage $V_{B1}$. Some prior art techniques such as emitter degeneration and cascoding can be used to help the power supply rejection of the device of FIG. 1, but do not allow the gain stage to swing as closely to the power supply rail.

FIG. 2 shows how emitter degeneration can be used to increase the power supply rejection at the expense of headroom. The prior art circuit of FIG. 2 includes transistors $Q_1$–$Q_3$, negative rail $V_{SS}$, positive rail $V_{DD}$, input voltage $V_{IN}$, output voltage $V_{OUT}$, bias voltage $V_{B1}$, and resistors $R_0$ and $R_1$. FIG. 3 shows how cascoding can also be used to increase the power supply rejection, again with a reduction in headroom. The prior art circuit of FIG. 3 includes transistors $Q_1$–$Q_3$, negative rail $V_{SS}$, positive rail $V_{DD}$, input voltage $V_{IN}$, output voltage $V_{OUT}$, bias voltage $V_{B1}$, and transistors $Q_4$ and $Q_5$. Other types of current mirrors can be used in place of the current mirror in FIG. 3 to improve the power supply rejection, but each of them will remove at least an additional $v_{be}$ drop from the headroom over the standard gain stage shown in FIG. 1.

SUMMARY OF THE INVENTION

Generally, and in one form of the invention, the gain stage circuit includes a first transistor having a control node coupled to a bias node; a second transistor having a control node coupled to the bias node; a third transistor coupled in series with the second transistor and having a control node coupled to an input node; a fourth transistor matched to the second transistor and having a control node coupled to the bias node; a current subtracting circuit coupled to the second and fourth transistors; and a quiet current generator coupled to the current subtracting circuit, the current subtracting circuit subtracts a current in the fourth transistor from a quiet current in the quiet current generator.

BRIEF DESCRIPTION OF THE DRAWINGS

In the drawings:

FIG. 1 is a schematic diagram of a prior art standard bipolar gain stage;

FIG. 2 is a schematic diagram of a prior art standard bipolar gain stage with emitter degeneration;

FIG. 3 is a schematic diagram of a prior art standard bipolar gain stage with cascoding;

FIG. 4 is a schematic diagram of a preferred embodiment gain stage with improved power supply rejection.

Corresponding numerals and symbols in the different figures refer to corresponding parts unless otherwise indicated.

DETAILED DESCRIPTION OF PREFERRED EMBODIMENTS

Referring to FIG. 4, a circuit diagram of a preferred embodiment gain stage with improved power supply rejection is shown. The circuit of FIG. 4 includes transistors $Q_1$–$Q_3$ and $Q_5$, transistors $Q_B$, $Q_C$, $Q_E$, $Q_F$, and $Q_G$, resistor $R_G$, negative rail $V_{SS}$, positive rail $V_{DD}$, input voltage $V_{IN}$, output voltage $V_{OUT}$, bias voltages $V_{B1}$ and $V_{B2}$, and control voltage $V_C$. By the addition of transistors $Q_E$, $Q_F$, and $Q_G$, and resistor $R_G$, the power supply rejection of the gain stage in FIG. 1 can be enhanced by a factor of 10 to 100. The addition of these components takes nothing away from the headroom of the gain stage. It is still capable of swinging to within a $V_{sat}$ of the power supply.

The circuit of FIG. 4 works by canceling out the current injected by transistor $Q_2$ into the output stage. This is done by making another current identical to the current in transistor $Q_2$. This is accomplished by making transistor $Q_5$ an identical match to transistor $Q_2$. The base (control node) of transistor $Q_5$ is coupled to the base of transistor $Q_2$. Then a quiet current is generated by quiet current generator 20 which does not have any dependance on the supply voltage. In FIG. 4, the quiet current flows through transistor $Q_G$. Typically the quiet current will be generated with diodes or some other type of reference voltage generator. Then current subtracting circuit 22 which includes transistors $Q_E$, $Q_B$, $Q_C$, and $Q_F$ will subtract the current in transistor $Q_5$ from the quiet current in transistor $Q_G$. The resulting output current from transistor $Q_E$ will be the difference between the quiet current and the noisy current. This difference is the negative of the noise injected from transistor $Q_2$ into the output. When these currents are combined at the output node they cancel. The only errors are due to the differences in the collector base voltages of transistors $Q_2$ and $Q_5$.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A gain stage circuit comprising:
   a first transistor having a control node and a current node coupled to a bias node;
   a second transistor having a control node coupled to the bias node;
   a third transistor coupled in series with the second transistor and halving a control node coupled to an input node and a current node for receiving a reference potential;
   a fourth transistor matched to the second transistor and having a control node coupled to the bias node, the first, second, and fourth transistors being coupled together to receive a supply voltage;
   a current subtracting circuit coupled to the second and fourth transistors; and
   a quiet current generator coupled to the current subtracting circuit, the current subtracting circuit subtracts a current in the fourth transistor from a quiet current in the quiet current generator.

2. The circuit of claim 1 wherein the current subtracting circuit comprises:
   a fifth transistor coupled in series with the fourth transistor;

a sixth transistor coupled in series with the second transistor and having a control node coupled to a control node of the fifth transistor;

a seventh transistor coupled in series with the fifth transistor; and an eighth transistor coupled in series with the sixth transistor and having a control node coupled to a control node of the seventh transistor.

3. The circuit of claim 1 wherein the quiet current generator comprises:

a current generator transistor having a control node coupled to a second bias node; and a resistor coupled between the current generator transistor and a control voltage node.

* * * * *